United States Patent
Baker et al.

(10) Patent No.: US 10,143,104 B2
(45) Date of Patent: Nov. 27, 2018

(54) ADAPTIVE MOUNTING RAIL AND MOUNTING ASSEMBLIES FOR ELECTRONIC DEVICES

(71) Applicant: SIEMENS AKTIENGESELLSCHAFT, München (DE)

(72) Inventors: James H. Baker, Johnson City, TN (US); Shawn McNabb, Unicoi, TN (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 0 days.

(21) Appl. No.: 15/281,195

(22) Filed: Sep. 30, 2016

(65) Prior Publication Data

US 2018/0098452 A1    Apr. 5, 2018

(51) Int. Cl.
| | |
|---|---|
| H05K 7/14 | (2006.01) |
| G05B 19/05 | (2006.01) |
| H05K 7/18 | (2006.01) |
| H05K 5/02 | (2006.01) |

(52) U.S. Cl.
CPC ........... *H05K 7/1474* (2013.01); *G05B 19/05* (2013.01); *H05K 7/183* (2013.01); *G05B 2219/31147* (2013.01); *H05K 5/0204* (2013.01)

(58) Field of Classification Search
CPC .... H05K 7/1474; H05K 5/0204; H05K 7/183; G05B 19/05
See application file for complete search history.

(56) References Cited

U.S. PATENT DOCUMENTS

| | | | | |
|---|---|---|---|---|
| 4,764,049 A * | 8/1988 | Brown | ................... | H05K 7/183 108/143 |
| 5,584,406 A * | 12/1996 | Besserer | ................. | F16M 1/00 211/189 |
| 6,331,935 B1 * | 12/2001 | Baran | ................... | G06F 1/1632 361/679.41 |
| 8,344,239 B2 * | 1/2013 | Plaisted | ................. | F24S 25/35 136/251 |
| 9,743,541 B1 * | 8/2017 | Chang | ..................... | B60R 11/02 |
| 9,747,823 B2 * | 8/2017 | Lorenzini | ........... | G09F 15/0062 |
| 2004/0165357 A1 * | 8/2004 | Schneeberger | .......... | H02B 1/04 361/724 |
| 2005/0175402 A1 * | 8/2005 | Schurr | .................... | H02B 1/052 403/331 |
| 2014/0132139 A1 * | 5/2014 | Chang | ................... | H05K 7/183 312/333 |
| 2014/0179133 A1 * | 6/2014 | Redel | ................... | H01R 25/142 439/121 |
| 2014/0340838 A1 * | 11/2014 | Deng | .................. | H05K 5/0204 361/679.33 |
| 2015/0129517 A1 * | 5/2015 | Wildes | .................... | H02S 20/23 211/41.1 |

(Continued)

*Primary Examiner* — Binh B Tran
*Assistant Examiner* — Douglas R Burtner

(57) ABSTRACT

An adaptive mounting rail includes a base element with a first side and a second side, a plurality of rails disposed on the first side of the base element for mounting an electronic device, and a first adaptive mounting element disposed on the second side of the base element allowing to removably mount the mounting rail to a support mounting rail. Further, mounting assemblies including the adaptive mounting rail are described.

15 Claims, 6 Drawing Sheets

(56) References Cited

U.S. PATENT DOCUMENTS

| | | | | |
|---|---|---|---|---|
| 2015/0181753 A1* | 6/2015 | Murakami | ............ | H05K 7/1489 |
| | | | | 211/26 |
| 2016/0262274 A1* | 9/2016 | Molnar | ................ | H05K 5/0026 |
| 2017/0055363 A1* | 2/2017 | Ankarbjork | .......... | H05K 5/0204 |
| 2017/0112016 A1* | 4/2017 | Chen | .................... | A47B 88/044 |
| 2017/0340110 A1* | 11/2017 | Chen | .................... | A47B 88/403 |
| 2017/0340111 A1* | 11/2017 | Chen | ....................... | F16C 29/04 |
| 2018/0140093 A1* | 5/2018 | Chen | .................... | A47B 88/423 |

\* cited by examiner

FIG. 1
FIG. 2
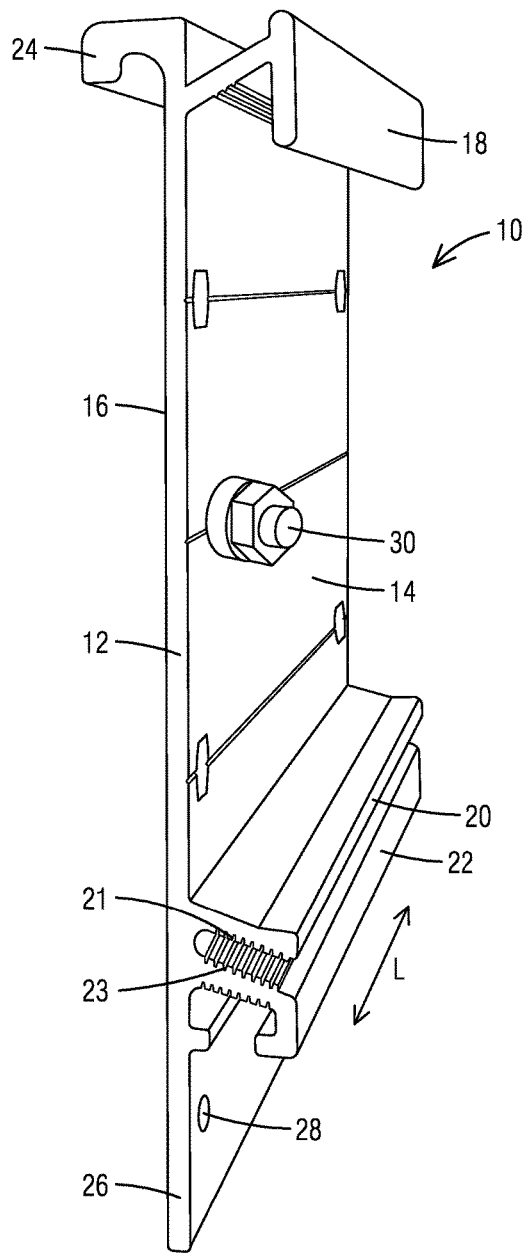
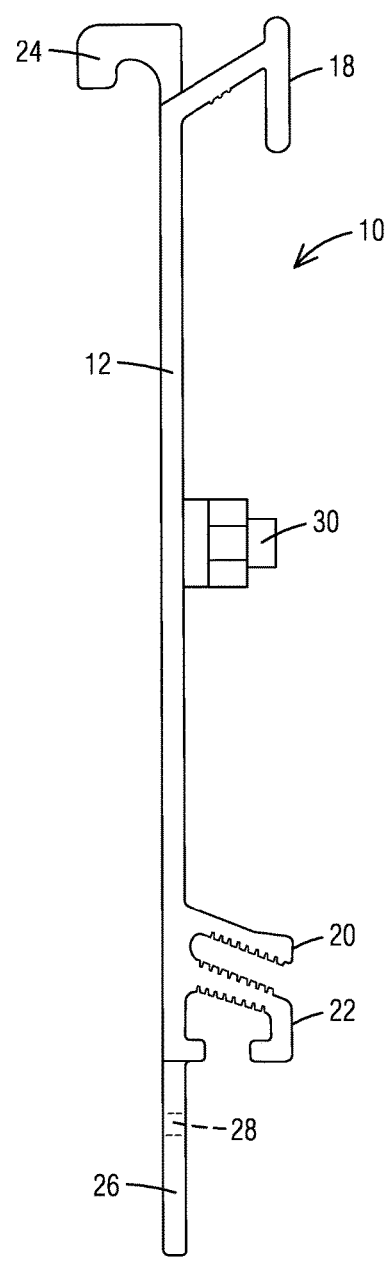

ADAPTIVE MOUNTING RAIL AND MOUNTING ASSEMBLIES FOR ELECTRONIC DEVICES

BACKGROUND

1. Field

Aspects of the present invention generally relate to an adaptive mounting rail and mounting assemblies for electronic devices, such as for example control devices including but not limited to programmable logic controllers.

2. Description of the Related Art

Industrial control systems can be used for monitoring parameters and/or controlling devices. Within industrial control systems, one or more sensors may be communicatively coupled to one or more electronic devices, such as for example programmable logic controller(s), herein referred to as PLC or PLCs, via one or more input/output (I/O) modules (e.g., a communication module). Via the I/O modules, the PLC(s) may control one or more devices such as, for example, a rheostat, a switch, a sequencer, a servo drive, a motor, and/or a valve etc.

A PLC is typically mounted to a back support system, which can include for example a control cabinet wall, shelf etc., via a mounting rail. There are different types of PLCs including for example different dimensions, wherein the different types of PLCs can require different form factors for mounting. For example, a PLC provided by the Applicant under the name SIMATIC® S7-300 conforms to a specific S7-300 mounting rail, wherein a PLC provided by the Applicant under the name SIMATIC® S7-1500 conforms to a specific S7-1500 mounting rail. A device that conforms to a S7-300 mounting rail cannot be mounted on a S7-1500 mounting rail. This can pose a problem for a customer because crucial real estate within a control enclosure is not being utilized to its maximum potential. Furthermore, each time an existing PLC needs to be replaced with another PLC of a different type, the mounting rail also needs to be changed which causes extra costs and time to install. Thus, a need exists for an improved mounting rail and mounting assemblies for mounting different electronic devices.

SUMMARY

Briefly described, aspects of the present invention relate to an adaptive mounting rail and mounting assemblies for electronic devices, such as for example control devices including but not limited to PLCs.

A first aspect of the present invention provides an adaptive mounting rail for an electronic device comprising a base element comprising a first side and a second side, a plurality of rails disposed on the first side of the base element for mounting an electronic device, and a first adaptive mounting element disposed on the second side of the base element allowing to removably mount the mounting rail to a support mounting rail.

A second aspect of the present invention provides a mounting assembly for electronic devices comprising an adaptive mounting rail comprising a base element comprising a first side and a second side, a plurality of rails disposed on the first side of the base element, and a first adaptive mounting element disposed on the second side of the base element, and a support mounting rail, wherein the adaptive mounting rail is removably mounted to the support mounting rail by the first adaptive mounting element, and wherein one or more electronic devices are mountable to the adaptive mounting rail via the plurality of rails.

A third aspect of the present invention provides a mounting assembly for electronic devices comprising an adaptive mounting rail comprising a base element comprising a first side and a second side, a plurality of rails disposed on the first side of the base element, and a first adaptive mounting element disposed on the second side of the base element, a support mounting rail, wherein the adaptive mounting rail is removably mounted to the support mounting rail via the first adaptive mounting element, and an electronic device removably mounted to the support mounting rail via the adaptive mounting rail.

BRIEF DESCRIPTION OF THE DRAWINGS

FIG. 1 illustrates a perspective view of an adaptive mounting rail for electronic devices in accordance with an exemplary embodiment of the present invention.

FIG. 2 illustrates a side view of an adaptive mounting rail for electronic devices in accordance with an exemplary embodiment of the present invention.

DETAILED DESCRIPTION

Figure 3:
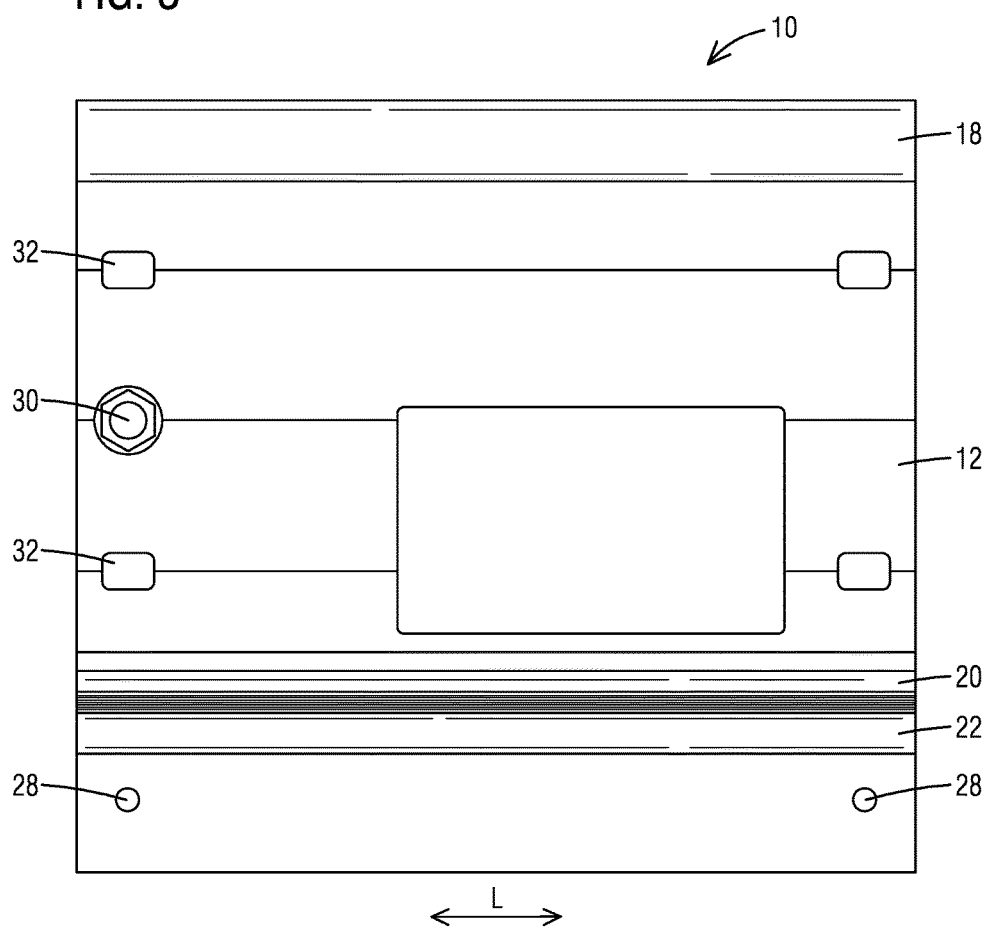
FIG. 3 illustrates a front view of an adaptive mounting rail for electronic devices in accordance with an exemplary embodiment of the present invention.

To facilitate an understanding of embodiments, principles, and features of the present invention, they are explained hereinafter with reference to implementation in illustrative embodiments. In particular, they are described in the context of an adaptive mounting rail and mounting assemblies including such an adaptive mounting rail for electronic devices, in particular for control devices such as a PLC. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

FIG. 1 illustrates a perspective view of an adaptive mounting rail 10 for electronic devices in accordance with an exemplary embodiment of the present invention.

As noted before, a PLC is typically mounted to a back support system, which can include for example a control cabinet wall, shelf etc., via a mounting rail. There are different types of electronic devices including for example different dimensions, wherein the different types of electronic devices require different form factors for mounting.

The adaptive mounting rail 10 as illustrated in FIG. 1 comprises a base element 12 with a first side 14 and a second side 16. The first side 14 and second side 16 are opposite each other, wherein the first side 14 can be considered as front and the second side 16 as back of the base element 12. The base element 12 is a generally planar elongated element comprising a length L. The length L can comprise any desired dimension. For example, the length L of the base element 12 and thereby of the mounting rail 10 can be 160 mm, 482 mm (19 inches), 530 mm, 830 mm, 2000 mm, etc.

A plurality of rails 18, 20, 22 are disposed on the first side 14 of the base element 12 designed for mounting one or more electronic devices to the mounting rail 10. The rails 18, 20, 22 extend in a horizontal direction over the entire length L of the base element 12. The plurality of rails 18, 20, 22 include the top rail 18 and the bottom rails 20, 22. The bottom rails 20, 22 comprise threaded surfaces 21, 23. The rails 20, 22 are arranged so that the threaded surfaces 21, 23 face each other and are arranged relatively close together. The threaded surfaces 21, 23 form a gap or interspace for receiving bolts or screws which are used to fasten an electronic device to the mounting rail 10.

Furthermore, the mounting rail 10 comprises a plurality of adaptive elements. A first adaptive mounting element 24 is disposed on the second side 16 of the base element 12 and can be configured for example as a top mounting hanger. A second adaptive mounting element 26 is part of or incorporated into the base element 12 and can be for example an extended bottom portion of the base element 12. According to an exemplary embodiment, the second adaptive mounting element 26 comprises one or more openings 28, for example bore holes, for securely fastening the mounting rail 10 to a further mounting rail, herein referred to as support mounting rail. The adaptive elements 24, 26 allow to removably mount the mounting rail 10 to the support mounting rail which will be explained in detail with reference to FIGS. 4-8.

FIG. 1 illustrates that the mounting rail 10 is an integrated, one piece component. According to an exemplary embodiment, the mounting rail 10 comprises metal, in particular aluminum. For example, the mounting rail 10 can be an extruded aluminum component. By using metal for the mounting rail 10, the mounting rail 10 can be used as a grounding surface because of the electrical conductivity of metal. In addition, metal is typically a good heat conductor and therefore the mounting rail 10 can be used as a heat sink to help dissipate heat from the device(s) mounted to the rail 10. It should be noted that the mounting rail 10 can comprise other suitable metals comprising the described characteristics.

In an exemplary embodiment, the adaptive mounting rail 10 is designed for mounting one or more PLC(s), such as for example a PLC SIMATIC® S7-300 provided by the Applicant. Such a PLC can be fastened to the mounting rail 10 directly with one or more screws using the threaded surfaces 21, 23 of the bottom rails 20, 22. Of course, other electronic devices suitable for the mounting rail 10 may be mounted to the adaptive mounting rail 10.

FIG. 2 illustrates a side view and FIG. 3 illustrates a front view of the adaptive mounting rail 10 in accordance with an exemplary embodiment of the present invention.

FIGS. 2 and 3 further illustrate a mounting element 30, which can comprise for example a screw or bolt. The mounting element 30 is configured as a ground conductor bolt for grounding any mounted device(s) to the mounting rail 10. As previously noted, the mounting rail 10 comprises metal thereby providing a grounding surface for any mounted device(s). The mounting element 30 helps reduce the likelihood of a mounted device being damaged from electrical discharge. Of course, the base element 12 comprises a corresponding opening for inserting the mounting element 30.

With reference to FIG. 3, the base element 12 can comprise a plurality of openings 32. The openings 32 are configured as mounting holes which can be used for installing the mounting rail 10 for example to a control cabinet or other back support system when the adaptive mounting rail 10 is not mounted to a further mounting rail.

Although it is preferred that the mounting rail 10 is an integrated, one piece component, the mounting rail 10 can alternatively be designed as multi-element component. As FIG. 2 illustrates, the adaptive mounting elements 24, 26 can be attached to the base element 12, for example by welding or brazing or alternatively via bolted connections.

Figure 4:
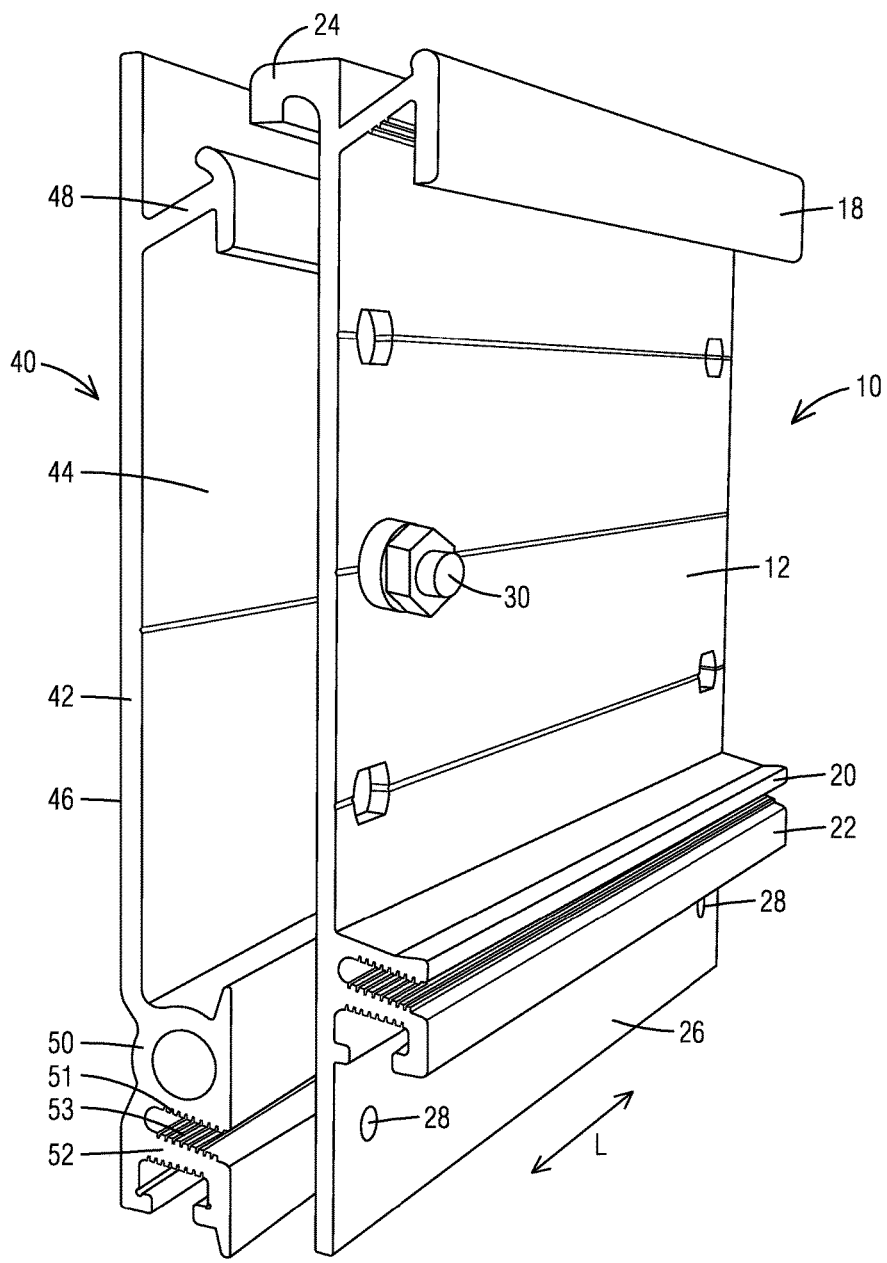
FIG. 4 illustrates a perspective view of an adaptive mounting rail and a support mounting rail for electronic devices in accordance with an exemplary embodiment of the present invention.

FIG. 4 illustrates a perspective view of the adaptive mounting rail 10 and an exemplary support mounting rail 40 for electronic devices in accordance with an exemplary embodiment of the present invention.

The support mounting rail 40 is configured as a mounting rail for different electronic devices compared to those mountable to the adaptive mounting rail 10. As noted before, in an exemplary embodiment, the adaptive mounting rail 10 can be designed for mounting one or more PLC(s), for example a PLC SIMATIC® S7-300 provided by the Applicant, wherein the support mounting rail 40 can be designed for mounting one or more PLC(s), for example a PLC SIMATIC® S7-1500 provided by the Applicant. Such a PLC can be fastened to the mounting rail 40 with a single screw, wherein the support mounting rail 40 is installed by screwing to a back support system such as for example a control cabinet wall.

The support mounting rail 40 comprises a base element 42 with a first side 44 and a second side 46. The first side 44 and second side 46 are opposite each other, wherein the first side 44 can be considered as front and the second side 46 as back of the base element 42. The base element 42 is a generally planar elongated element comprising a length L. The length L can comprise any desired dimension. For example, the length L of the base element 42 and thereby of the mounting rail 40 can be 160 mm, 482 mm (19 inches), 530 mm, 830 mm, 2000 mm, etc. The support mounting rail 40 and the adaptive mounting rail 10 can comprise a same length L or can comprise different lengths L. In an embodiment, the length L of the adaptive mounting rail 10 is equal or less than a length of the support mounting rail 40.

A plurality of rails 48, 50, 52 are disposed on the first side 44 of the base element 42 for mounting one or more electronic devices to the mounting rail 40. The rails 48, 50, 52 extend in a horizontal direction over the entire length L of the base element 42 and the mounting rail 40. The plurality of rails 48, 50, 52 include the top rail 48 and the bottom rails 50, 52. The bottom rails 50, 52 comprise threaded surfaces 51, 53. The rails 50, 52 are arranged so that the threaded surfaces 51, 53 face each other and are arranged relatively close together. The threaded surfaces 51, 53 form a gap or interspace for receiving bolts or screws which are used to fasten an electronic device to the mounting rail 40. Further, the bottom rails 50, 52 form an integrated DIN rail for snapping on a wide range of standard electronic components such as for example terminals, miniature circuit breakers, or small relays.

The support mounting rail 40 is an integrated, one piece component. According to an exemplary embodiment, the mounting rail 40 comprises metal, in particular aluminum. For example, the support mounting rail 40 can be an extruded aluminum component.

Figure 5:
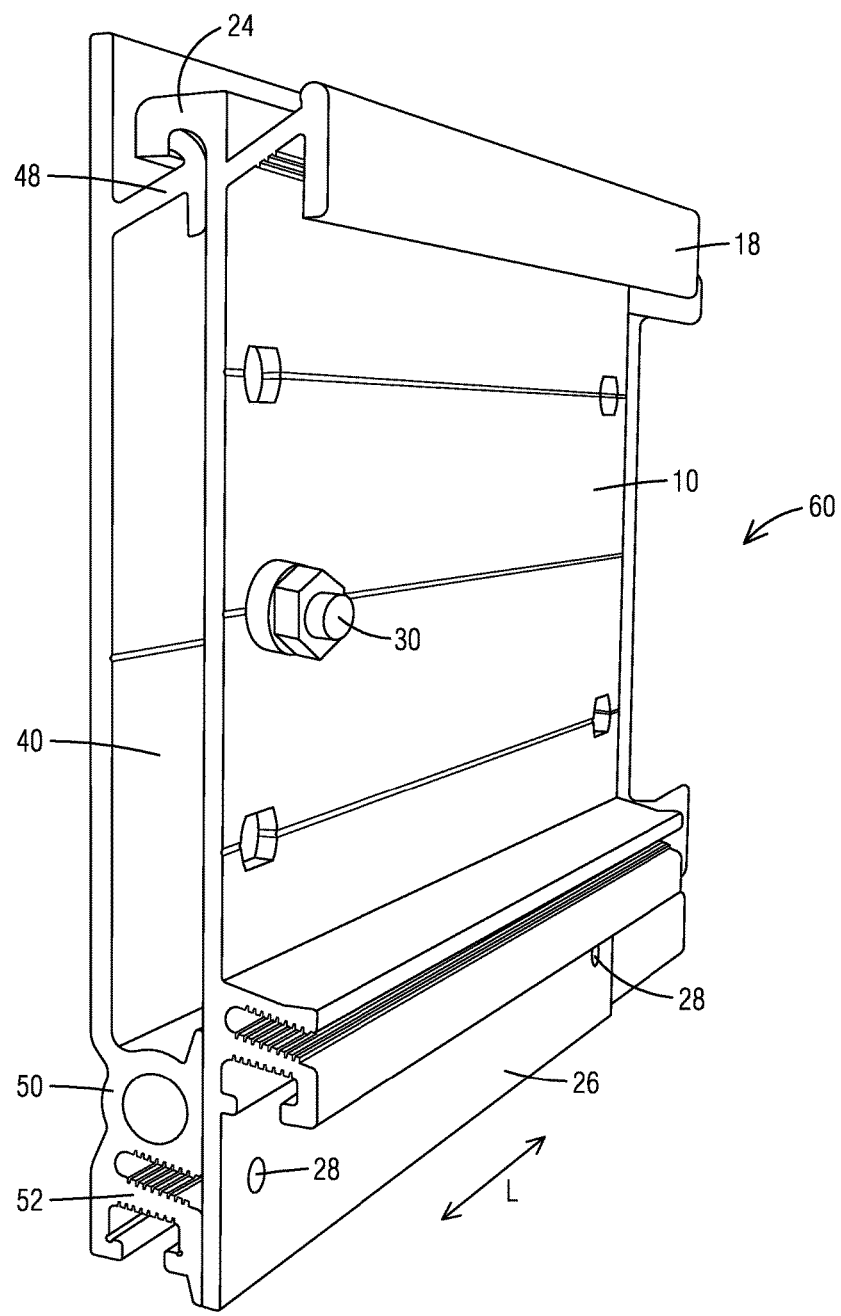
FIG. 5 illustrates a perspective view of a mounting assembly including an adaptive mounting rail in accordance with an exemplary embodiment of the present invention.

FIG. 5 illustrates a perspective view of a mounting assembly 60 including the adaptive mounting rail 10 and the support mounting rail 40 in accordance with an exemplary embodiment of the present invention. FIG. 5 illustrates the adaptive mounting rail 10 assembled with the support mounting rail 40. The concept includes hanging and screwing the adaptive mounting rail 10 to the further mounting rail 40 in a similar manner to how an electronic device for the support mounting rail 40 would be mounted to the mounting rail 40. The adaptive mounting rail 10 is designed to rest flush against the support mounting rail 40.

The first adaptive element 24 of the adaptive mounting rail 10 is designed to rest on the top rail 48 of the support mounting rail 40. The second adaptive element 26 of the mounting rail 10 rests flush against the bottom rails 50, 52 of the mounting rail 40. The openings 28 of the second adaptive element 26 are placed so that bolts or screws 29 inserted in the openings 28 are received by the opposed threaded surfaces 51, 53 of the bottom rails 50, 52 to securely fasten the adaptive mounting rail 10 to the support mounting rail 40 (see FIG. 8).

Figure 6:
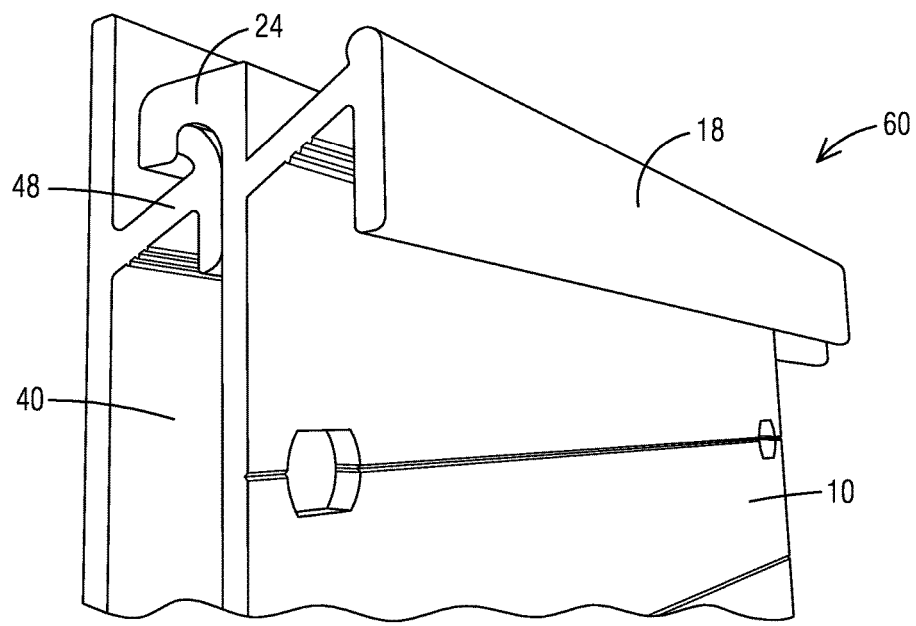
FIG. 6 illustrates a first enlarged perspective view of a first part of a mounting assembly as illustrated in FIG. 5 in accordance with an exemplary embodiment of the present invention.

FIG. 6 illustrates a first enlarged perspective view of a first part of a mounting assembly 60 as illustrated in FIG. 5 in accordance with an exemplary embodiment of the present invention. As described before, the first adaptive element 24 of the adaptive mounting rail 10 is configured as a top mounting hanger that allows the mounting rail 10 to rest on the support mounting rail 40, specifically on the top rail 48 of the mounting rail 40.

Figure 7:
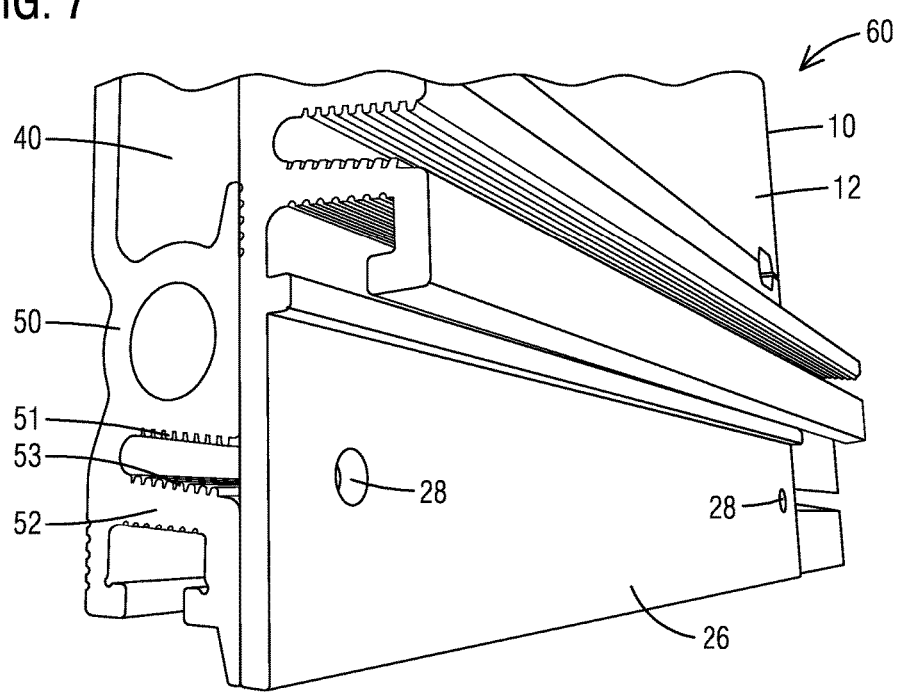
FIG. 7 illustrates a second enlarged perspective view of a second part of a mounting assembly as illustrated in FIG. 5 in accordance with an exemplary embodiment of the present invention.

FIG. 7 illustrates a second enlarged perspective view of a second part of a mounting assembly 60 as illustrated in FIG. 5 in accordance with an exemplary embodiment of the present invention. The second adaptive element 26 of the adaptive mounting rail 10, configured as extended bottom portion of the base element 12, rests flush at least partially against the bottom rails 50, 52 of the support mounting rail 40. As described before, using the openings 28, the adaptive mounting rail 10 can be securely fastened to the mounting rail 40.

Figure 8:
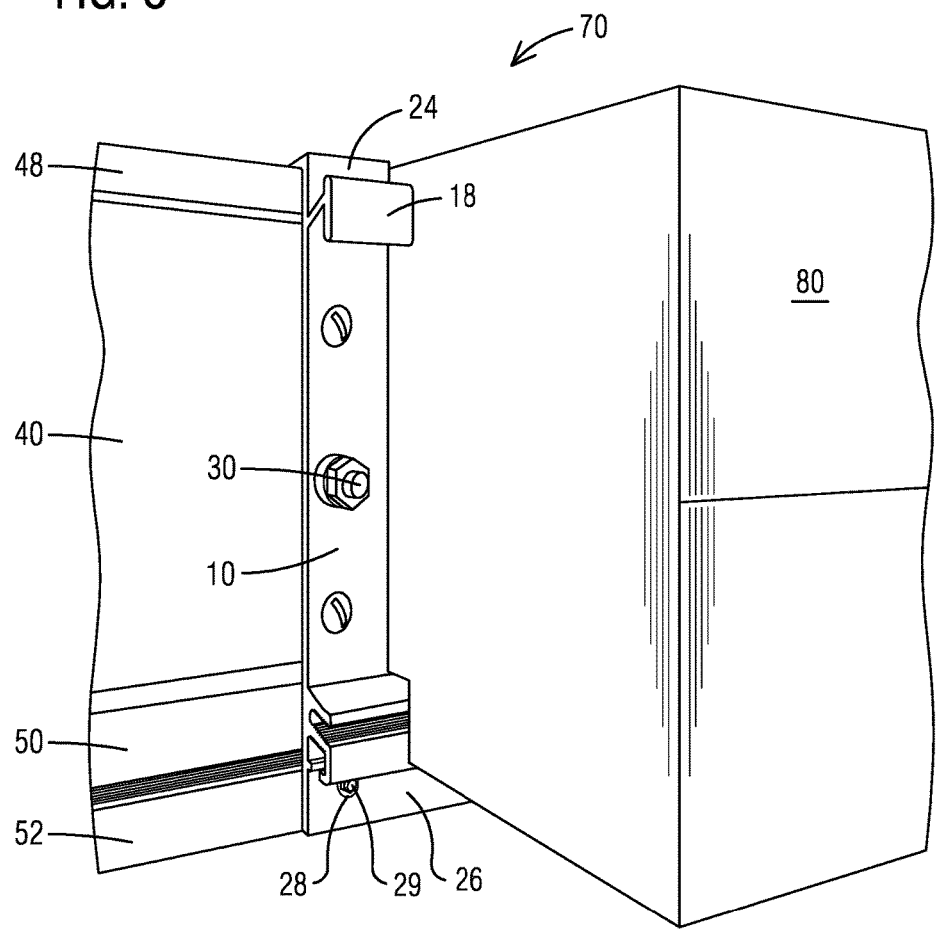
FIG. 8 illustrates a perspective view of a mounting assembly including an adaptive mounting rail, a support mounting rail and an electronic device in accordance with an exemplary embodiment of the present invention.

FIG. 8 illustrates a perspective view of a mounting assembly 70 including the adaptive mounting rail 10, the support mounting rail 40 and an electronic device 80 in accordance with an exemplary embodiment of the present invention.

In order to mount the adaptive mounting rail 10 to the support mounting rail 40, the first adaptive element 24, configured as a top mounting hanger of the adaptive mounting rail 10, is placed on top of the top rail 48 of the support mounting rail 40 at a slight angle. When placing the adaptive element 24 (top mounting hanger) on top of the top rail 48, the slight angle between the adaptive mounting rail 10 and the support mounting rail 40 can be for example between 1° and 90°. Then, the adaptive mounting rail 10 is pivoted down and fastened securely to the support mounting rail 40 via the second adaptive element 26 of the mounting rail 10. Specifically, the mounting rail 10 is screwed securely to the support mounting rail 40 using screws or bolts 29 through openings 28 to anchor between threaded surfaces 51 and 53 to secure element 26 to the face of bottom rails 50 and 52.

The electronic device 80 is mounted to the adaptive mounting rail 10 in a similar manner. The top portion of the electronic device 80 is placed on top of the top rail 18 of the adaptive mounting rail 10 at a slight angle, for example between 1° and 90° measured between the mounting rail 10 and the electronic device 80, pivoted down and fastened, for example screwed, securely to the adaptive mounted rail 10. As noted before, the electronic device 80 can be a PLC including a power supply module, a central processing unit (CPU), interface modules, input/output modules, etc. Of course, many other electronic devices suitable for the mounting rail 10 may be mounted to the mounting rail 10. Electronic devices may also be mounted to the support mounting rail 40, for example when the adaptive mounting rail 10 is shorter in length than the support mounting rail 40 as illustrated for example in FIG. 8.

The adaptive mounting rail 10 is configured so that one or more electronic devices are mountable to the mounting rail 10 while in turn the mounting rail 10 is mountable to the support mounting rail 40 which comprises different form factors for mounting different electronic devices. For example, a customer or user has installed the support mounting rail 40 within a control cabinet for electronic devices. If the customer or user wishes to install an electronic device which requires the form factors of the mounting rail 10, the customer or user simply mounts the adaptive mounting rail 10 to the existing mounting rail 40 and can then install the electronic devices for the mounting rail 10. Without the adaptive mounting rail 10, the customer would have to remove the mounting rail 40 and install a new mounting rail conforming to the specific form factors of the electronic devices. Furthermore, since the adaptive mounting rail 10 is removably mounted to the support mounting rail 40, the mounting rail 10 can be easily removed (and installed again) at any time and the entire support mounting rail 40 can be used for mounting electronic devices.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

The invention claimed is:

1. An adaptive mounting rail for an electronic device comprising:
    a base element comprising a first side and a second side;
    a plurality of rails disposed on the first side of the base element for mounting an electronic device; and
    a first adaptive mounting element disposed on the second side of the base element allowing to removably mount the adaptive mounting rail to a support mounting rail,
    wherein the first adaptive mounting element comprises a top mounting hanger allowing the adaptive mounting rail to rest on a top rail of the support mounting rail, and
    wherein the plurality of rails comprises bottom rails comprising threaded surfaces, the bottom rails being arranged so that the threaded surfaces face each other and form a gap for receiving bolts or screws used to fasten an electronic device.

2. The adaptive mounting rail for an electronic device of claim 1, wherein the base element, the plurality of rails and the first adaptive mounting element are configured as integral components of the adaptive mounting rail.

3. The adaptive mounting rail for an electronic device as claimed in claim 1, wherein the adaptive mounting rail is configured as an extruded one piece component.

4. The adaptive mounting rail for an electronic device as claimed in claim 1, wherein the adaptive mounting rail is configured as an extruded aluminum component.

5. The adaptive mounting rail for an electronic device as claimed in claim 1, further comprising:
a second adaptive mounting element extending from the base element and comprising one or more openings for fastening the adaptive mounting rail to the support mounting rail.

6. The adaptive mounting rail for an electronic device as claimed in claim 5, wherein the first adaptive element and the second adaptive element extend in a horizontal direction over an entire length of the base element.

7. A mounting assembly for electronic devices comprising:
an adaptive mounting rail comprising:
a base element comprising a first side and a second side;
a plurality of rails disposed on the first side of the base element; and
a first adaptive mounting element disposed on the second side of the base element; and
a support mounting rail comprising a top rail and bottom rails for mounting electronic devices, wherein the adaptive mounting rail is removably mounted to the support mounting rail by the first adaptive mounting element, and wherein one or more electronic devices are mountable to the adaptive mounting rail via the plurality of rails,
wherein the adaptive mounting rail further comprises a second adaptive mounting element extending from the base element and comprising one or more openings for fastening the adaptive mounting rail to the support mounting rail, and
wherein the bottom rails of the support mounting rail comprise opposite threaded surfaces, the threaded surfaces forming an interspace aligned with the openings of the adaptive mounting rail.

8. The mounting assembly for electronic devices of claim 7, wherein the first adaptive mounting element is configured as a mounting hanger and rests on the top rail of the support mounting rail.

9. The mounting assembly for electronic devices of claim 7, wherein the second adaptive mounting element at least partially rests flush at against the bottom rails of the support mounting rail.

10. The mounting assembly for electronic devices of claim 7, wherein the adaptive mounting rail and the support mounting rail are extruded aluminum components.

11. A mounting assembly for electronic devices comprising:
an adaptive mounting rail comprising:
a base element comprising a first side and a second side;
a plurality of rails disposed on the first side of the base element; and
a first adaptive mounting element disposed on the second side of the base element;
a support mounting rail comprising a top rail and bottom rails, wherein the adaptive mounting rail is removably mounted to the support mounting rail via the first adaptive mounting element; and
an electronic device removably mounted to the support mounting rail via the adaptive mounting rail,
wherein the adaptive mounting rail further comprises a second adaptive mounting element extending from the base element and comprising one or more openings for fastening the adaptive mounting rail to the support mounting rail, and
wherein the bottom rails of the support mounting rail comprise opposite threaded surfaces, the threaded surfaces forming an interspace aligned with the openings of the adaptive mounting rail.

12. The mounting assembly for electronic devices of claim 11, wherein the first adaptive mounting element is configured as a mounting hanger and rests on a top rail of the support mounting rail.

13. The mounting assembly for electronic devices of claim 11, wherein the adaptive mounting rail rests flush against the support mounting rail.

14. The mounting assembly for electronic devices of claim 11, wherein the support mounting rail comprises a first length and the adaptive mounting rail comprises a second length which is equal or less than the first length of the mounting rail.

15. The mounting assembly for electronic devices of claim 11, wherein the electronic device comprises one or more programmable logic controllers.

* * * * *